United States Patent [19]

Maeda et al.

[11] Patent Number: 4,948,700
[45] Date of Patent: Aug. 14, 1990

[54] LIQUID LIGHT-SENSITIVE RESINOUS COMPOSITION

[75] Inventors: Minoru Maeda; Yuichi Wakata; Sadao Fujikura; Masayuki Iwasaki, all of Shizuoka, Japan

[73] Assignee: Fuji Photo Film Co., Ltd., Kanagawa, Japan

[21] Appl. No.: 389,144

[22] Filed: Aug. 3, 1989

[30] Foreign Application Priority Data

Aug. 4, 1988 [JP] Japan .................. 63-194865

[51] Int. Cl.$^5$ ............................................ G03C 1/727
[52] U.S. Cl. .................................... 430/280; 430/281; 522/101
[58] Field of Search ...................... 430/280, 281, 287; 522/101

[56] References Cited

U.S. PATENT DOCUMENTS 4,398,013  8/1983  Johnson ..................... 522/101

*Primary Examiner*—Paul R. Michl
*Assistant Examiner*—Carmelle Veasley
*Attorney, Agent, or Firm*—Sughrue, Mion, Zinn, Macpeak & Seas

[57] ABSTRACT

A liquid heat- and light-sensitive resinous composition which contains as main components (A) a photopolymerizable compound prepared by reacting a novolak type epoxy compound with successively, an unsaturated monocarboxylic acid represented by at least one of formula (I) and (II) and a saturated or unsaturated polybasic acid anhydride, (B) a photopolymerizable compound having at least one ethylenic unsaturated double bond, (C) an epoxy compound having at least one epoxy group, (D) a photopolymerization initiator, (E) a thermosetting catalysts capable of making an epoxy group undergo a thermal reaction, and (F) an organic solvent;

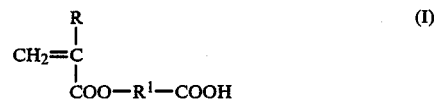

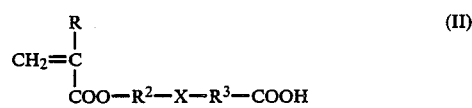

wherein R represents -H or -CH$_3$; R$^1$, R$^2$ and R$^3$ each represents an unsubstituted or substituted alkylene group, an unsubstituted or substituted arylene group, or an unsubstituted or substituted aralkylene group; and X represents -COO-, -OCO- or -O-.

The composition exhibits photo- and thermocurability, developability with an alkaline aqueous solution and ability to form a permanent protective mask for printed circuit boards.

12 Claims, No Drawings

LIQUID LIGHT-SENSITIVE RESINOUS COMPOSITION

FIELD OF THE INVENTION

This invention relates to a liquid, light-sensitive, resinous composition and, more particularly, to a light- and heat-curable, light-sensitive, liquid, resinous composition which can be used for forming a permanent protective mask, such as solder resist or the like, to be employed for the production of printed circuit boards (printed wiring boards), has high sensitivity and high resolution to ultraviolet irradiation, and forms by curing a dry film excellent in electrical and mechanical characteristics.

BACKGROUND OF THE INVENTION

Resinous compositions which have so far been used for permanent protective masks, such as solder resist, chemical galvanizing resist, etc., in the printed circuit industry are those containing a heat-curable resin such as an epoxy resin, a melamine resin or the like as a main component, and pattern formation using them have been performed frequently by the screen printing process. A primary end of solder resists consists in making a barrier to the soldering region to prevent the generation of solder bridges and the corrosion to conductors, and further to retain electric insulation between conductors over a long period of time.

However, with the recent advances of high density mounting, such as very large scale integration (LSI) or the like, a reduction of the space between conductors have been required, severe demands have been imposed on electric insulation between conductors, and excellent dimensional precision has been required of solder resist and the like. On the other hand, the screen printing process has essentially low resolving power, and is subject to various phenomena, such as blur and pinholes (in case of highly viscous ink), or bleeding, blot and slack (in case of ink with low viscosity). Therefore, the screen printing process has been unable to cope with a sharp increase in mounting density of a printed circuit boards.

Under these circumstances, light-sensitive resinous compositions which enable the pattern formation using photography (the image formation through development subsequent to imagewise exposure), have high sensitivity and high resolution, and are excellent in not only adhesiveness to a substrate, but also electrical and mechanical characteristics when made into dry films by curing, are watched with keen interest.

Also, light-sensitive resinous compositions of the type which can be developed with an alkaline aqueous solution or water have recently been desired from the standpoints of the betterment of the working environment, the reduction in the corruption of water quality, and so on.

Dry film type or liquid-state, developable, light-sensitive, resinous compositions have been developed as permanent protective masks for printed circuit boards to have patterns formed in accordance with photography.

As light-sensitive resinous compositions of the dry film type, for instance, JP-A-No. 57-55914 (the term "JP-A" as used herein means an "unexamined published Japanese patent application") (corresponding to U.S. Pat. No. 4,499,163) discloses films comprising urethanedi(meth)acrylate(s), linear high molecular compounds and photosensitizers, and JP-A-No. 62-247353 discloses films comprising specified novolak type epoxy resins modified by (meth)acrylic compound(s), and photosensitizers.

In general, however, light-sensitive resinous compositions of the dry film type tend to generate bubbles upon hot press adhesion, and are questionable as to heat resistivity and adhesiveness. Although JP-A-No. 52-52703 (corresponding to U.S. Pat. No. 4,101,364) discloses a special process including a step of performing hot press adhesion under reduced pressure with the intention of solving those problems, even this process was unable to ensure complete heat resistivity and adhesiveness.

On the other hand, a developable, light-sensitive, liquid, resinous composition is coated directly on a printed circuit board immediately before use as it is in liquid state, so the number of steps is less. In addition, because the compositions is liquid, it can form an image of high quality on a printed circuit board even when its surface is rugged, and is best suited, e.g., for a light-sensitive resinous composition, to form a permanent protective mask for a printed circuit board having a narrow space between conductors.

However, the liquid, light-sensitive, resinous composition of this type also has a defect that when exposure is carried out after the coating on a printed circuit board with pattern mask direct contact with the surface of the film formed, the pattern mask is stained.

For the purpose of obviating the stain problem of the pattern mask, there has been proposed a special process, as disclosed, for example, in JP-A-No. 57-164595, in which a pattern mask is arranged so as to leave a space between the pattern mask and a coated, but undried, light-sensitive resinous compositions, the composition is cured by optical exposure, and the uncured portion of the composition is removed. This is different from a general process comprising coating a liquid light-sensitive resinous composition on a printed circuit board and drying the composition to make into a dry film. However, this wet process also has difficulties in that since there is a need to leave a space between the coated liquid light-sensitive composition and the pattern mask because the composition is not first made into a dry film, the resolution becomes so much the worse, the process costs much because a special equipment is required, and so on.

Still another process of producing solder resist is disclosed, for example, in JP-A-No. 58-24144 and JP-A-No. 59-2049, in which a liquid light-sensitive resinous composition is coated in a uniform thickness on an active rays transmitting, transparent flexible support or a pattern mask, and immediately thereafter the flexible support and the pattern mask is moved so as to bring the coated composition into a face-to-face contact with a printed circuit board, and the coated composition is pressed against the printed circuit board under a definite pressure, thus laminating the liquid light-sensitive resinous composition in a uniform thickness, and then exposure is carried out and the flexible support or the pattern mask is peeled apart, followed by development. According to this process, there are brought up some questions that since air is caught in the laminate due to unevenness of the printed circuit board when the liquid light-sensitive resinous composition coated uniformly on the transparent flexible support or the pattern mask is pressed against the printed circuit board, resulting in the formation of bubbles in no small numbers inside the developed image, there is precariousness in heat resistance and adhesiveness, this process cost much because of a special equipment required, and so on.

A further process of preparing solder resist is disclosed in JP-A-No. 61-102652 and JP-A-No. 62-27736, which comprises coating a liquid light-sensitive composition on a printed circuit board, pressing a transparent flexible support or a pattern mask against the coated composition under a definite pressure, exposing them through the pattern mask, peeling apart the flexible support or the pattern mask, and developing the exposed coat. In this process also, special equipment for pressing the flexible support or the pattern mask under a definite pressure and exposing it to light is required, raising expenses.

Moreover, the above-described processes of exposing a liquid light-sensitive composition to light following a resist pattern as it is without drying have a problem that they are inferior to general ones in characteristics which they can ensure to the resulting solder resist, e.g., acid resistance, chemical resistance and so on, because the liquid light-sensitive composition uses a liquid prepolymer containing a great number of reactive monomers.

As examples of liquid light-sensitive resinous compositions to be employed for the solder resist formation process in which a liquid light-sensitive resin is coated, dried by heating, made to stand in close contact with a pattern mask, exposed to light, and developed, mention may be made of a liquid resist ink composition as disclosed in JP-A-No. 61-243869, which contains a compound obtained by making a novolak type epoxy resin, an unsaturated monocarboxylic acid and a polybasic acid anhydride to react with one another, and a liquid resinous composition as disclosed in JP-A-No. 62-187722, which contains as a main component a bisphenol type epoxy resin having unsaturated groups and carboxyl groups.

However, those liquid light-sensitive resinous compositions have disadvantages that since the photopolymerizing compounds obtained by making the epoxy resins contained as a main component to undergo the reaction are lower in sensitivity than ordinary photopolymerizable monomers, it takes a long time to effect exposure, so the working efficiency is lowered, or the photomask is damaged due to a rise in temperature during the exposure step.

SUMMARY OF THE INVENTION

Therefore, an object of this invention is to solve the conventional technical deficiencies as described above, and to provide a liquid light-sensitive resinous composition which can form a bubble-free, light-sensitive resin layer having a uniform thickness on a printed circuit boards, enables the exposure in a condition that the dried surface of the composition coat and a pattern mask are in contact with each other by making the composition coat surface lose its tackiness through heating prior to the exposure of the light-sensitive resinous composition coated on the printed, circuit boards, can be cured by both light and heat, has high sensitivity to light, and can be developed with an alkaline aqueous solution. The composition, after being initially heat cured, remains soluble in an alkaline aqueous solution, and only becomes insoluble after exposure to light.

The above-described object is attained with a liquid light-sensitive resinous composition containing as main components (A) a photopolymerizable compound prepared by reacting novolak type epoxy compound with, successively, an unsaturated monocarboxylic acid(s) represented by the general formula (I) and/or (II) and a saturated or unsaturated polybasic acid anhydride;

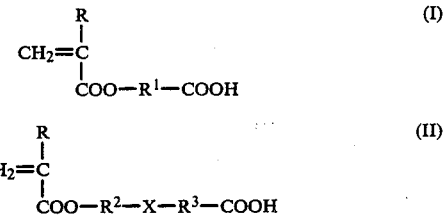

wherein R represents —H or —CH$_3$; R$^1$, R$^2$ and R$^3$ each represents an unsubstituted or substituted alkylene group containing 1 to 10, preferably 2 to 6, carbon atoms, an unsubstituted or substituted arylene group containing 6 to 12, preferably 6 to 10, carbon atoms, or an unsubstituted or substituted aralkylene group containing 7 to 21, preferably 7 to 15, carbon atoms; and X represents —COO—, —OCO—, or —O—;

(B) a photopolymerizable compound having at least one ethylenic unsaturated double bond;

(C) an epoxy compound having at least one epoxy group;

(D) a photopolymerization initiator, (E) a thermosetting catalysts capable of making an epoxy group undego a thermal reaction; and (F) an organic solvent.

With respect to formulae (I) and (II), R$^1$ is preferably —CH$_2$—CH$_2$—, —CH$_2$—CH(CH$_3$)— or —CH$_2$—CH$_2$—CH$_2$—CH$_2$—CH$_2$—, R$^2$ is preferably —CH$_2$—CH$_2$— or —CH$_2$—CH(CH$_3$)— and R$^3$ is preferably —CH$_2$—CH$_2$—,

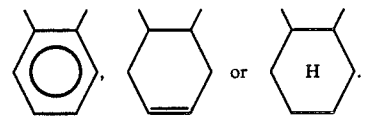

DETAILED DESCRIPTION OF THE INVENTION

The liquid light-sensitive resinous composition of this invention contains as an essential component a photopolymerizable compound prepared by reacting a novolak type epoxy compound react with, successively, an unsaturated monocarboxylic acid(s), and saturated or unsaturated polybasic acid anhydride(s).

The representative of novolak type epoxy compounds which can be used in this invention are phenol novolak type epoxy resins, cresol novolak type epoxy resins, and halogenated phenol novolak type epoxy resins, which are obtained by firstly preparing novolak type resins by the reaction of phenols, cresols and halogenated phenols, respectively, with aldehydes in the presence of an acid catalyst, and then making the phenolic hydroxyl groups of the novolak type resins react with epichlorohydrin in the presence of an alkali, preferably phenol novolak type epoxy resins and cresol novolak type epoxy resins.

Suitable examples of unsaturated monocarboxylic acids which can be used include a dimer of acrylic or methacrylic acid, products obtained by the reaction of acrylic or methacrylic acid with cyclic acid anhydrides such as a caprolactone, products obtained by the reaction of hydroxyalkyl esters of acrylic or methacrylic acid with dibasic acid anhydrides, and products obtained by the reaction of hydroxyalkyl esters of acrylic or methacrylic acid with halogen-containing carboxylic acid compounds.

In addition, commercial unsaturated monocarboxylic acids including Aronix M-5300 ($CH_2=CHCOO+C_5-C_{10}COO+_2H$, M-5400

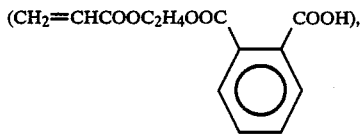

M-5500 ($CH_2=CHCOOC_2H_4OOCC_2H_4COOH$) and M-5600 ($CH_2=CHCOO+CH_2-CH_2-COO+_{21}H$) produced by Toa Gosei Chemical Industry Co., Ltd., NK Ester CB-1 and CBX-1 produced by Shin Nakamura Kagaku Kogyo K.K., HOA-mP and HOA-MS produced by Kyoeisha Oil Chemical Ind. Co., Ltd., and Biskote #2100 produced by Osaka Yuki Kagaku Kogyo K.K. can be used.

Typical representative acid anhydrides which can be used include dibasic acid anhydrides such as succinic anhydride, methylsuccinic anhydride, 2,3-dimethylsuccinic anhydride, 2,2-dimethylsuccinic anhydride, ethylsuccinic anhydride, dodecenylsuccinic anhydride, nonenylsuccinic anhydride, maleic anhydride, methylmaleic anhydride, 2,3-dimethylmaleic anhydride, 2-chloromaleic anhydride, 2,3-dichloromaleic anhydride, bromomaleic anhydride, itaconic anhydride, citraconic anhydride, aconitic anhydride, phthalic anhydride, tetrahydrophthalic anhydride, tetrachlorophthalic anhydride, tetrabromophthalic anhydride, hexahydrophthalic anhydride, methyltetrahydrophthalic anhydride, methylhexahydrophthalic anhydride, endomethylenetetrahydrophthalic anhydride, methylendomethylenetetrahydrophthalic anhydride, chlorendic anhydride, and 5-(2,5-di-oxotetrahydrofuryl)-3-methyl-3-cyclohexene-1,2-dicarboxylic acid anhydride; and polybasic acid anhydrides, such as trimellitic acid anhydride, 3,3',4,4'-benzophenonetetracarboxylic acid anhydride, and so on. Among these acid anhydrides, dibasic acid anhydrides are preferred over others.

In the successive reactions of a novolak type epoxy resin with these components for the production of a photopolymerizable compound, the proportion of carboxyl groups of the unsaturated carboxylic acid taking part in the reaction is 0.8 to 1.2 equivalent, preferably 0.9 to 1.1 equivalent, to 1 equivalent of epoxy groups of the novolak type epoxy resin, and that of the polybasic acid anhydride is 0.1 to 1.0 equivalent, preferably 0.3 to 1.0 equivalent, to 1 equivalent of epoxy groups of the novolak type epoxy resin.

The photopolymerizable compound can be used in an amount of 10 to 60 parts by weight, preferably 20 to 50 parts by weight, per 100 parts by weight of solid components (the remaining total composition other than the organic solvent) in the liquid light-sensitive resinous composition.

As examples of a photopolymerizable compound having at least one ethylenic unsaturated double bond which is to be used in this invention, mention may be made of esters prepared from monohydric or polyhydric alcohols and acrylic or methacrylic acid.

Suitable examples of monohydric alcohols which can be employed for the preparation of acrylic or methacrylic acid esters include methanol, ethanol, propanol, isopropanol, n-butanol, isobutanol, t-butanol, cyclohexyl alcohol, benzyl alcohol, octyl alcohol, 2-ethylhexanol, lauryl alcohol, n-decanol, undecanol, hexadechl alcohol, stearyl alcohol, methoxyethyl alcohol, ethoxyethyl alcohol, butoxyethyl alcohol, polyethylene glycol monomethyl alcohol, polyethylene glycol monoethyl alcohol, 2-hydroxy-3-chloropropane, dimethylamino alcohol, diethylamino alcohol, glycidol, 2-trimethoxysilylethanol, ethylenechlorohydrin, ethylenebromohydrin, 2,3-dibromopropanol, allyl alcohol, oleyl alcohol, epoxystearyl alcohol, phenol, naphthol, and so on. Suitable examples of polyhydric alcohols which can be used herein include ethylene glycol, 1,2-propanediol, 1,3-propanediol, 1,4-butanediol, 1,5-pentanediol, hexanediol, heptanediol, octanediol, nonanediol, dodecanediol, neopentyl glycol, 1,10-decanediol, 2-butene-1,4-diol, 2-n-butyl-2-ethylpropanediol, cycloheptanediol, 1,4-cyclohexanedimethanol, 3-cyclohexene-1,1-diethanol, polyethylene glycol (e.g., diethylene glycol, triethylene glycol), polypropylene glycol(e.g., dipropylene glycol, tripropylene glycol), polystyreneoxide glycol, polytetrahydrofuran glycol, xylylenediol, bis($\beta$-hydroxyethoxy)benzene, 3-chloro-1,2-propanediol, 2,2-di-methyl-1,3-propanediol, 2,2-diethyl-1,3-propanediol, 2,2-diphenyl-1,3-propanediol, decalindiol, 1,5-dihydroxy-1,2,3,4-tetrahydronaphthalene, 2,5-dimethyl-2,5-hexanediol, 2-ethyl-1,3-hexanediol, 2-ethyl-2-(hydroxymethyl)-1,3-propanediol, 2-ethyl-2-methyl-1,3-propanediol, 3-hexene-2,5-diol, hydroxybenzyl alcohol, 2-methyl-1,4-butanediol, 2-methyl-2,4-pentanediol, 1-phenyl-1,2-ethanediol, 2,2,4,4-tetramethyl-1,3-cyclobutanediol, 2,3,5,6-tetramethyl-p-xylene-$\beta,\beta'$-diol, 1,1,4,4-tetraphenyl-2-butene-1,4-diol, 1,1'-bi-2-naphthol, dihydroxynaphthalene, 1,1'-methylene-di-2-naphthol, biphenol, 2,2-bis(4-hydroxyphenyl)butane, 1,1-bis(4-hydroxyphenyl)cyclohexane, bis(hydroxyphenyl)methane, catechol, resorcinol, 2-methylresorcinol, 4-chlororesorcinol, pyrogallol, $\alpha$-(1-aminoethyl)-p-hydroxybenzyl alcohol, 2-amino-2-methyl-1,3-propanediol, 2-amino-2-ethyl-1,3-propanediol, 3-amino-1,2-propanediol, N-(3-aminopropyl)-diethanolamine, N,N-bis(2-hydroxyethyl)piperazine, 1,3-bis(hydroxymethyl)urea, 1,2-bis(4-pyridyl)-1,2-ethanediol, N-n-butyldiethanolamine, diethanolamine, N-ethyldiethanolamine, 3-mercapto-1,2-propanediol, 3-piperizine-1,2-propanediol, 2-(2-pyridyl)-1,3-propanediol, $\alpha$-(1-aminoethyl)-p-hydroxybenzyl alcohol, glycerine, trimethylolethane, trimethylolpropane, pentaerythritol, dipentaerythritol, tripentaerythritol, sorbitol, glucose, $\alpha$-mannitol, butanetriol, 1,2,6-trihydroxyhexane, 1,2,4-benzenetriol, triethanolamine, 2,2-bis(hydroxymethyl)-2,2',2"-nitrilotriethanol, and so on.

Among the acrylic or methacrylic acid esters of these monohydric or polyhydric alcohols, ethylene glycol diacrylate, ethylene glycol dimethacrylate, polyethylene glycol diacrylate, polyethylene glycol dimethacrylate, pentaerythritol triacrylate, pentaerythritol trimethacrylate, pentaerythritol tetraacrylate pentaerythritol tetramethacrylate, dipentaerythritol hexaacrylate, dipentaerythritol hexamethacrylate, dipentaerythritol pentaacrylate, dipentaerythritol pentamethacrylate, glycerine triacrylate, glycerine trimethacrylate, trimethylolpropane triacrylate, trimethylolpropane trimethacrylate, trimethylolethane triacrylate, timethylolethane trimethacrylate, neopentyl glycol diacrylate, neopentyl glycol dimethacrylate, sorbitol hexaacrylate, sorbitol hexamethacrylate, sorbitol pentaacrylate, sorbitol pentamethacrylate and the like are preferred over others.

In addition, acrylamides or methacrylamides of monoamines or polyamines can be used. As examples of monoamines which can be used herein, mention may be made of monoalkylamines such as ethylamine, butylamine, amylamine, hexylamine, octylamine, cyclohexylamine, 9-aminodecalin, etc.; monoalkenylamines such as allylamine, methallylamine, benzylamine, etc., and aromatic amines such as aniline, toluidine, p-aminostyrene, etc. As examples of polyamines which can be used herein, mention may be made of ethylenediamine, trimethylenediamine, tetramethylenediamine, hexamethylenediamine, octamethylenediamine, hexamethylenebis(2-aminopropyl)amine, diethylenetriamine, triethylenetetramine, polyethylenepolyamine, tris(2-aminoethyl)amine, 4,4'-methylenebis(cyclohexylamine), N,N'-bis(2-aminoethyl)-1,3-propanediamine, N,N'-bis(3-aminopropyl)-1,4-butanediamine, N,N-bis(3-aminopropyl)ethylenediamine, N,N'-bis(3-aminopropyl)-1,3-propanediamine, 1,3-cyclohexanebis(methylamine), phenylenediamine, xylylenediamine, β-(4-aminophenyl)ethylamine, diaminotoluene, diaminoanthracene, diaminonaphthalene, diaminostyrene, methylenedianiline, 2,4-bis(4-aminobenzyl)aniline, aminophenyl ether, and the like.

Further, allyl compounds, e.g., mono- or polyallyl esters of mono- or poly-carboxylic acids such as formic acid, acetic acid, propionic acid, butyric acid, lauric acid, benzoic acid, chlorobenzoic acid, malonic acid, oxalic acid, glutaric acid, adipic acid, sebacic acid, phthalic acid, terephthalic acid, hexahydrophthalic acid, chlorendic acid, trimellitic acid, etc., polyallyl esters of mono- or poly-sulfonic acids such as benzenedisulfonic acid, naphthalenedisulfonic acid, etc., diallylamine, N,N'-diallyloxalic acid diamide, 1,3-diallylurea, diallyl ether, triallyl isocyanurate, and so on can be used.

Furthermore, polyvinyl compounds, such as divinylbenzene, p-allylstyrene, p-isopropenylstyrene, divinylsulfone, ethylene glycol divinyl ether, glycerol trivinyl ether, divinyl succinate, divinyl phthalate, divinyl terephthalate, etc., and ester compounds of ionic group-containing acrylic or methacrylic acid, such as 2-hydroxy-3-methacryloyloxypropyltrimethylammonium chloride, methacryloyloxyphenyltrimethylammonium chloride, etc., can be used.

Moreover, commercial photopolymerizable monomers and oligomer, e.g., acrylate monomers such as Aronix

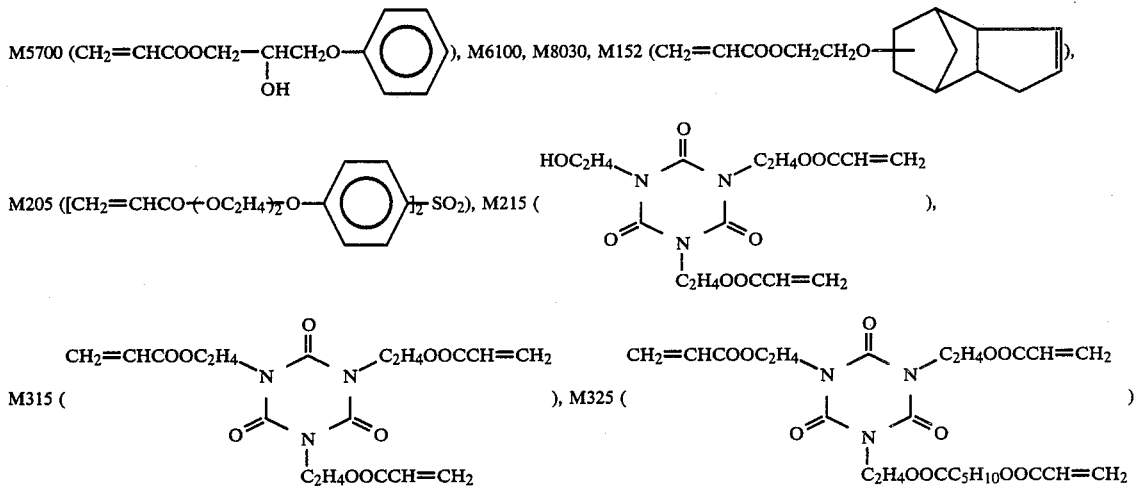

produced by Toa Gosei Chemical Industry Co., Ltd.; acrylate or methacrylate monomers such as NK Ester ABPE-4

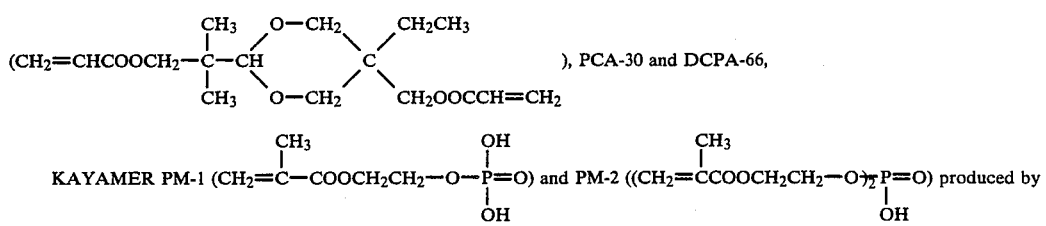

U-4HA, CB-1 and CBX-1 produced by Shin Nakamura Kagaku Kogyo K.K., KAYARAD R604

Nippon Kayaku Co., Ltd., and Photomer 4061 and 5007 produced by San Nopco Co., Ltd.; epoxy acrylates such as Ripoxy VR60, VR90 and SP1509 produced by Showa Highpolymer Co., Ltd.; and spiropyran resins having a spiroacetal structure and acryl or methacryl groups, such as Spilak E-4000X and U3000 produced by Showa Highpolymer Co., Ltd.; can be used.

These compounds may be used alone or as a mixture of two or more thereof, and they can be contained in an amount of 1 to 40 parts by weight, preferably 2 to 30 parts by weight, per 100 parts by weight of the solid components in the liquid lightsensitive resinous composition.

Suitable examples of a photopolymerization initiator which can be used in this invention include α-diketones such as benzyl, diacetyl, etc., acyloins such as benzoin, etc., acyloin ethers such as benzoin methyl ether, benzoin ethyl ether, benzoin isopropyl ether, etc., thioxanthones such as thioxanthone, 2,4-diethylthioxanthone, thioxanthone-1-sulfonic acid, thioxanthone-4-sulfonic acid, etc., benzophenones such as benzophenone, 4,4'-bis(dimethylamino)benzophenone, 4,4'-bis(diethylamino)benzophenone, etc., acetophenones such as acetophenone, p-dimethylaminoacetophenone, α,α'-dimethoxyacetoxyacetophenone, 2,2'-dimethoxy-2-phenylacetophenone, p-methoxyacetophenone, 2-methyl[4-(methylthio)phenyl]-2-morpholino-1-propanone, etc., quinones such as anthraquinone, 1,4-naphthoquinone, etc., halogenated compounds such as phenacyl chloride, tribromomethylphenylsulfone, tris(trichloromethyl)-s-triazine, etc., peroxides such as di-t-butyl peroxide, etc., and so on.

These photopolymerization initiators may be used alone or as a mixture of two or more thereof, and they can be contained in an amount of 0.1 to 20 parts by weight, preferably 0.2 to 10 parts by weight, per 100 parts by weight of the solid components in the liquid light-sensitive resinous composition.

As examples of compounds having at least one epoxy group which can be used in this invention, mention may be made of glycidyl ether type epoxy compounds, such as glycidyl ethers of alcohols containing 2 to 20 carbon atoms, e.g., butyl glycidyl ether, octyl glycidyl ether, decyl glycidyl ether, aryl glycidyl ether, phenyl glycidyl ether, etc., polyglycidyl ethers of polyols, e.g., polyethylene glycol diglycidyl ether, polypropylene glycol diglycidyl ether, ethylene glycol diglycidyl ether, propylene glycol diglycidyl ether, neopentyl glycol diglycidyl ether, 1,6-hexanediol diglycidyl ether, dibromoneopentyl glycol diglycidyl ether, glycerol triglycidyl ether, trimethylolpropane triglycidyl ether, diglycerol tetraglycidyl ether, polyglycerol polyglycidyl ether, etc., 2,6-diglycidylphenyl glycidyl ether, 2,6,2',6'-tetramethyl-4,4'-biphenyl diglycidyl ether, bisphenol A type epoxy resins, hydrogenated bisphenol A type epoxy resins, bisphenol F type epoxy resins, hydrogenated bisphenol F type epoxy resins, bisphenol S type epoxy resins, hydrogenated bisphenol S type epoxy resins, phenol novolak type epoxy resins, cresol novolak type epoxy resins, halogenated phenol novolak type epoxy resins, brominated epoxy resins, and so on; alicyclic epoxy compounds such as alicyclic diepoxyacetal, alicyclic diepoxyadipate, alicyclic diepoxydiadipate, vinylcyclohexene dioxide, and so on; glycidyl ester type epoxy compounds, such as unsaturated acid glycidyl esters including glycidylacrylate, glycidylmethacrylate, tetrahydroxyphthalic acid diglycidyl ester, sorbic acid glycidyl ester, oleic acid glycidyl ester, linolenic acid glycidyl ester, etc., alkylcarboxylic acid glycidyl esters including butyl glycidyl ester, octyl glycidyl ester, hexahydrophthalic acid diglycidyl ester, dimeric acid glycidyl ester, etc., aromatic carboxylic acid glycidyl esters including benzoic acid glycidyl ester, o-phthalic acid glycidyl ester, diglycidyl p-hydroxybenzoate, etc., and so on; glycidylamine type epoxy compounds, such as tetraglycidyldiaminodiphenylmethane, triglycidyl-p-aminophenol, triglycidyl-m-aminophenol, diglycidylaniline, diglycidyltoluidine, tetraglycidyl-m-xylylenediamine, diglycidyltribromoaniline, tetraglycidylbisaminomethylcyclohexane, and so on; and heterocyclic epoxy compounds such as diglycidylhydantoin, glycidylglycidoxyalkylhydantoin, triglycidylisocyanurate, and so on.

These epoxy compounds can be used in an amount of 1 to 40 parts by weight, preferably 5 to 30 parts by weight, per 100 parts by weight of the solid components in the liquid light-sensitive resinous composition.

As suitable examples of thermosetting catalysts which can make an epoxy group undergo a thermal reaction, mention may be made of known epoxy curing accelerators, such as amine compounds including aliphatic primary amines such as polyamines, e.g., diethylenetriamine, triethylenetetramine, tetraethylenepentamine, iminobispropylamine (dipropyltriamine), bis(hexamethylene)triamine, 1,3,6-trisaminomethylhexane, etc., polymethylenediamines, e.g., trimethylhexamethylenediamine, polyether diamine, diethylaminopropylamine, etc., and alicyclic polyamines, e.g., menthenediamine, isophoronediamine, bis(4-amino-3-methylcyclohexyl)methane, N-aminoethylpiperazine, etc., aromatic primary amines such as metaphenylenediamine, diaminophenylmethane, diaminophenylsulfone and aromatic diamine eutectic mixtures, modified amines such as polyamineepoxy resin adducts, polyamine-ethylene oxide adducts, polyamine-propylene oxide adducts, cyanoethylated polyamines and ketoimines, secondary amines such as piperizine, piperazine and morpholine, and tertiary amines such as tetramethyl guanidine, triethanolamine, benzyldimethylamine and 2,4,6-tris(dimethylaminomethyl)phenol; acid anhydrides such as aromatic anhydrides, e.g., phthalic anhydride, trimellitic anhydride, ethylene glycol bis(anhydrotrimellitate), glycerine tris(anhydrotrimellitate), pyromellitic anhydride, 3,3',4,4'-benzophenonetetracarboxylic acid anhydride, etc., alicyclic acid anhydrides, e.g., maleic anhydride, succinic anhydride, tetrahydrophthalic anhydride, methyltetrahydrophthalic anhydride, endomethylenetetrahydrophthalic anhydride, methylendomethylenetetrahydrophthalic anhydride, alkenylsuccinic anhydride, hexahydrophthalic anhydride, methylhexahydrophthalic anhydride, methylcyclohexenetetracarboxylic acid anhydride, etc., aliphatic acid anhydrides, e.g., polyadipic anhydride, polyazelaic anhydride, polysebacic anhydride, etc., and halogenated acid anhydrides, e.g., chlorendic anhydride, tetrabromophthalic anhydride, etc.; imidazole compounds such as 2-methylimidazole, 2-ethyl-4-methyimidazole, 2-undecylimidazole, 2-heptadecylimidazole, 2-phenylimidazole, 1-benzyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-undecylimidazolium trimellitate, 1-cyanoethyl-2-phenylimidazolium trimellitate, 2-methylimidazolium isocyanurate, 2-phenylimidazolium isocyanurate, 2,4-di-amino-6-[2-methylimidazolyl-(1)]-ethyl-s-triazine, 2,4-diamino-6-[2-ethyl-4-methylimidazolyl-(1)]-ethyl-s-triazine, 2,4-di-amino-6-[2-undecylimidazolyl-(1)]-ethyl-s-triazine, 2-phenyl-4-methyl-5-hydroxymethylimidazole, 2-phenyl-4,5-dihydroxymethylimidazole, 1-cyanoethyl-2-phenyl-4,5-di(-cyanoethoxymethyl)imidazole, 1-dodecyl-2-methyl-3- benzylimidazolium chloride and 1,3-dibenzyl-2-methylimidazolium chloride; phenols such as novolak type phenol resins, cresol type phenol resins, resorcinol type phenol resins and polyvinylphenol; Lewis acid-amine complexes such as boron trifluoride-amine complex, boron pentafluorideamine complex and arsenic pentafluoride-amine complex; dicyandiamide derivatives such as dicyandiamide, o-tolylbiguanide, phenylbiguanide and o-2,5-dimethylbiguanide; organic acid hydrazides such as succinic acid hydrazide, adipic acid dehydrazide, isophthalic acid hydrazide and p-hydroxybenzoic acid hydrazide; diaminomaleonitrile derivatives such as diaminomaleonitrile and benzyldiaminomaleonitrile; melamine derivatives such as melamine and N,N-diallylmelamine; amineimide derivatives; polymercaptanes; and so on.

These thermosetting catalysts can be used in an amount of 0.01 to 10 parts by weight, preferably 0.05 to 5 parts by weight, per 100 parts by weight of the solid components in the liquid light-sensitive resinous composition.

As suitable examples of organic solvents which can be used, mention may be made of ketones such as methyl ethyl ketone, cyclohexanone, etc., aromatic hydrocarbons such as toluene, xylene, etc., cellosolves such as cellosolve, butyl cellosolve, etc., carbitols such as carbitol, butyl carbitol, etc., acetic acid esters such as ethyl acetate, butyl acetate, cellosolve acetate, butylcellosolve acetate, carbitol acetate, butylcarbitol acetate, etc., and so on.

These organic solvents can be used in an amount of 10 to 50 parts by weight, preferably 20 to 40 parts by weight, per 100 parts by weight of the liquid light-sensitive resinous composition.

In compounding the liquid light-sensitive resinous composition, a thermopolymerization inhibitor is preferably admixed in order to prevent polymerization during drying. As examples of thermopolymerization inhibitors which are preferably used for the above-described purpose, mention may be made of aromatic hydroxy compounds such as hydroquinone, p-methoxyphenyl, p-t-butylcatechol, 2,6-di-t-butyl-p-cresol, $\beta$-naphthol, pyrogallol, etc., quinones such as benzoquinone, p-toluquinone, etc., amines such as naphthylamine, pyridine, p-toluidine, phenothiazine, etc., aluminium or ammonium salts of N-nitrosophenylhydroxylamine, phloranil, nitrobenzene, and so on.

Further, auxiliary additives such as a tackifier, and adhesion accelerator, a dispersant, a plasticizer, a slack inhibitor, a leveling agent, a defoaming agent, a flame retarder, a brightener, a coloring agent and so on may be added to the liquid light-sensitive resinous composition of this invention, if desired.

As examples of tackifiers and adhesion accelerators which can be used, mention may be made of alkylphenol/formaldehyde novolak resins, polyvinyl ethyl ether, polyvinyl isobutyl ether, polyvinyl butyral, polyisobutylene, styrene-butadiene copolymers, butyl rubber, vinyl chloride-vinyl acetate copolymers, chlorinated rubber, acryl resin type tackifiers, petroleum resins of aromatic, aliphatic or alicyclic type, and so on.

The addition of a tackifier or an adhesion accelerator can increase the postcuring adhesiveness between the light-sensitive resin and the substrate. This effect can be fully achieved in particular in the cases of a copper printed circuit board and a solder printed circuit board.

A dispersant is used for making improvements, e.g., in dispersibility and storage stability of the liquid light-sensitive composition. The need of adding a plasticizer, a slack inhibitor, a leveling agent and a defoaming agent depends on how to use the liquid light-sensitive resinous composition, or the manner of foaming a dry film of the liquid light-sensitive resinous composition, and the kinds and the amounts of these additives can be properly chosen.

Some of the above-described auxiliary additives not only demonstrate one kind of property (e.g., dispersibility, plasticity, or a slack inhibiting, a leveling or a defoaming effect), but also have plural effects. For instance, some dispersants can function as a plasticizer, a leveling agent and a defoaming agent for the liquid light-sensitive resinous composition, and some dispersants, some slack inhibitors, some leveling agents and some defoaming agents can have an effect on the postphotocuring luster of the light-sensitive resinous composition, that is to say, can function as brightener.

Examples of dispersants which can be used include fluorine-containing high molecular compounds, surfactants, modified lecithin, non-silicon long-chain carboxylic acid amine salts, organic montmorillonlte, and so on.

Examples of plasticizers which can be used include glycol esters such as ethylene glycol diphthalate, diethylene glycol diphthalate, ethylene glycol dicapric acid ester, diethylene glycol dicapric acid ester, etc., phthalic acid esters such as dimethyl phthalate, diethyl phthalate, dibutyl phthalate, dioctyl phthalate, diaryl phthalate, butyl benzyl phthalate, etc., phosphoric acid esters such as triphenyl phosphate, tricresyl phosphate, etc., diethyl maleate, dibutyl adipate, triethyl citrate, ethyl laurate, and so on.

Examples of slack inhibitors which can be used include fine powders of inorganic substances such as talc, mica, silicon dioxide, titanium dioxide, calcium carbonate, magnesium carbonate, barium carbonate, calcium sulfate, magnesium sulfate, barium sulfate, etc.

Examples of coloring agents which can be used include inorganic pigments such as titanium oxide, carbon black iron oxide, etc., organic dyes such as Methylene Blue, Crystal Violet, Rhodamine B, Fuchsine, Auramine, azo dyes, anthraquinone dyes, etc., and organic pigments of phthalocyanine or azo type, such as Phthalocyanine Blue, Phthalocyanine Green, etc.

Examples of flame retarders which can be used include inorganic flame retarders such as antimony trioxide, zirconium hydroxide, barium metaborate, magnesium hydroxide, aluminium hydroxide, etc., halogen-containing flame retarders such as tetrabromobisphenol A, chlorinated paraffin, perchloropentacyclodecane, tetrabromobenzene, chlorinated diphenyl, etc., and phosphorus-containing flame retarders such as phosphonitrile chloride derivatives, vinyl phosphate, allyl phosphate, tris($\beta$-chloroethyl)phosphate, tricresyl phosphate, ammonium phosphate, etc.

In the image formation using the thus prepared liquid light-sensitive resinous composition, the composition of this invention is coated on a substrate, cured by heating to render the coat surface inadhesive, brought into face-to-face contact with a pattern mask, exposed to light, and then developed with an alkaline aqueous solution to elute the uncured coat therewith.

The liquid light-sensitive resinous composition of this invention can be coated on a substrate using a process such as a spray process, a dip process, a brush coating process, a roller coating process, a flow coater process, a curtain coating process, a screen printing process, and so on. Of these processes, a roller coating process, a curtain coating process and a screen printing process are preferred in particular in coating on printed circuit boards, thin metal films and the like.

The liquid light-sensitive resinous composition of this invention can be cured by both heat and light. When the composition is used as photoresist, the tackiness of the coat surface is made to vanish by heat curing prior to exposure to active rays. Therein, it is desirable to perform the heat curing under such a condition that a curing time ranges from 5 to 30 minutes under a temperature from 70° C. to 120° C. As a result of the heat curing described above, the surface of the cured coat becomes sufficiently inadhesive to enable exposure to be carried out in a condition that the cured coat and a pattern mask are in contact with each other.

Examples of exposure light sources which can be used for photocuring of the liquid light-sensitive resinous composition of this invention include a low pressure mercury lamp, a medium pressure mercury lamp, a high pressure mercury lamp, an ultra high pressure mercury lamp, a xenon lamp, a metal halide lamp, and laser beams. Of these light sources, exposure devices equipped with a high pressure mercury lamp, an ultra high pressure mercury lamp or a metal halide lamp, which emits ultraviolet rays at wavelengths from about 300 nm to about 400 nm, are preferably used.

The liquid light-sensitive resinous composition of this invention can be developed with an alkaline aqueous solution. As a developing solution, for example, a 0.1 to 10 wt % aqueous solution of sodium hydroxide, potassium hydroxide, lithium hydroxide, sodium carbonate, potassium carbonate, lithium carbonate, ammonia or the like can be employed. In addition, amines with examples including primary amines, such as butylamine, hexylamine, benzylamine, allylamine, etc., secondary amines, such as diethylamine, benzylethylamine, etc., tertiary amines such as triethylamine, etc., hydroxylamines such as ethanolamine, diethanolamine, triethanolamine, 2-amino-1,3-propanediol, etc., cyclic amines such as morpholine, pyridine, piperazine, piperizine, etc., polyamines such as hydrazine, ethylenediamine, hexamethylenediamine, etc., basic salts of these amines, such as sulfates, carbonates, hydrogen carbonates, alkali metal phosphates, pyrophosphates, etc., hydroxyl salts, such as tetramethylammonium hydroxide, chlorine, etc., and so on can be used depending on circumstances.

Further, the liquid light-sensitive resinous composition of this invention can optionally be heated after image formation to effect aftercuring, and thereby can be obtained the cured film improved in heat resistance. The heating time employable therein is, e.g., 10 to 60 minutes at 120° to 170° C.

The heating treatment for curing before exposure and for aftercuring after image formation can be effected with a heating apparatus such as a hot-air circulation type drying oven, a far infrared drying oven, or the like.

This invention will now be illustrated in more detail by reference to the following examples. However, the invention should not be construed as being limited to these examples. Additionally, in the following examples, all parts are by weight unless otherwise indicated.

SYNTHESIS EXAMPLE

To an epoxy resin and an unsaturated monocarboxylic acid as set forth in Table 1, were added benzyltriethylammonium chloride (1 mol % to the epoxy groups) and hydroquinone (700 ppm). The resulting mixture was stirred for 5 hours at 100° C.

To the reaction product was added an acid anhydride as set forth in Table 1, and stirring was continued for 4 hours at 100° C.

Thereto, carbitol acetate was added, and then the reaction system was made into a 70% aqueous solution. Thus, the intended carboxyl-modified epoxy resins (from No. 1 to No. 9) were prepared.

EXAMPLES 1 TO 7 AND COMPARABLE EXAMPLES 1 AND 2

The component $M_1$ to $M_9$ and the component $N_1$ were prepared using the carboxyl-modified epoxy resins 1 to 9, respectively, described in the synthesis example according to the following formulae.

TABLE 1

List of Carboxyl-Modified Epoxy Resins

| Resin No. | Epoxy Resin | | | Unsaturated Monocarboxylic Acid | | Polybasic Acid Anhydride | |
|---|---|---|---|---|---|---|---|
| | Structure | Epoxy Equivalence | parts by weight | Structure | parts by weight | Structure | parts by weight |
| 1 | cresol novolak type | 212 | 100 | acrylic acid dimer | 71.3 | tetrahydro-phthalic anhydride | 70.4 |
| 2 | phenol novolak type | 181 | 100 | acrylic acid dimer | 83.7 | tetrahydro-phthalic anhydride | 82.0 |
| 3 | cresol novolak type | 212 | 100 | Aronix M-5300 | 147.4 | tetrahydro-phthalic anhydride | 70.4 |
| 4 | cresol novolak type | 212 | 100 | Aronix M-5400 | 101.7 | tetrahydro-phthalic anhydride | 70.4 |
| 5 | phenol novolak type | 181 | 100 | Aronix M-5500 | 153.5 | tetrahydro-phthalic anhydride | 82.6 |
| 6 | cresol novolak type | 212 | 100 | acrylic acid dimer | 71.3 | succinic anhydride | 46.2 |
| 7 | phenol novolak type | 181 | 100 | acrylic acid dimer | 83.8 | succinic anhydride | 54.3 |
| 8 | bisphenol A type | 186 | 100 | acrylic acid dimer | 81.3 | tetrahydro-phthalic anhydride | 80.0 |

TABLE 1-continued
List of Carboxyl-Modified Epoxy Resins

| Resin No. | Epoxy Resin Structure | Epoxy Equivalence | parts by weight | Unsaturated Monocarboxylic Acid Structure | parts by weight | Polybasic Acid Anhydride Structure | parts by weight |
|---|---|---|---|---|---|---|---|
| 9 | cresol novolak type | 212 | 100 | acrylic acid | 35.7 | tetrahydro-phthalic anhydride | 70.4 |

Note:
Epoxy equivalence means the weight of resin per 1 g of the epoxy group.

(Component M)

| | |
|---|---|
| Carboxyl-modified epoxy resin of Table 1 | 350 parts |
| Flowlen [AC-300] (a defoaming agent produced by Kyoeisha Oil Chemical Ind. Co., Ltd.) | 15 parts |
| Phthalocyanine Green | 7.5 parts |
| Irgacure 907 (a photopolymerization initiator produced by Ciba Geigy Co., Ltd.) | 27.5 parts |
| Silica | 5 parts |
| Barium sulfate | 90 parts |
| 1-Benzyl-2-methylimidazole | 10 parts |
| in total | 500 parts |

(Component $M_1$)

| | |
|---|---|
| Triglycidylisocyanurate | 100 parts |
| Dipentaerythritol hexaacrylate | 36 parts |
| Talc | 14 parts |
| Cellosolve acetate | 50 parts |
| in total | 200 parts |

The above-described components $M_1$ to $M_9$, and $N_1$ were kneaded separately with a roll mill to prepare ink samples.

Then, each of these ink samples $M_1$ to $M_9$ was kneaded together with the ink sample $N_1$ to prepare a liquid light-sensitive resinous compositions (Examples 1 to 7, and Comparative Examples 1 and 2).

EXAMPLES 8 TO 11, AND COMPARATIVE EXAMPLE 3

A component $N_2$ was prepared according to the following formula.

(Component $N_2$)

| | |
|---|---|
| 2,6,2',6'-Tetramethyl-4,4'-biphenyl diglycidyl ether | 66 parts |
| Dipentaerythritol hexaacrylate | 34 parts |
| Barium sulfate | 52 parts |
| Cellosolve acetate | 48 parts |
| in total | 200 parts |

After kneading the above-described component to prepare ink, the ink was kneaded together with each of the components $M_1$, $M_3$, $M_6$, $M_7$ and $M_9$ prepared in Examples 1, 3, 6 and 7, and Comparative Example 2, respectively, to obtain the liquid light-sensitive resinous compositions (Examples 8 to 11, and Comparative Example 3). Properties of the thus prepared compositions were evaluated in the following manner.

(1) Formation of Dry Film:

The liquid light-sensitive resinous compositions prepared under various conditions were coated on the whole surfaces of separate copper-covered laminates, which had been subjected to the pretreatment including polishing, washing and moisture-removing steps, in accordance with a screen printing process, placed in a hot-air circulation type drying oven, and dried for 30 minutes at 70° C. to from dry films.

(2) Evaluation of Developability:

Each dry film was developed under the following condition, and the time at which the dry film was dissolved in the developer was measured.

Developer: 1% aqueous solution of sodium carbonate.
Temperature of Developer: 25° C.
Spraying Pressure: 1.8 kg/cm$^2$ (3) Evaluation of Sensitivity:

A step wedge having a difference of 0.15 (expressed in terms of $\Delta \log E$) in density level was brought into contact with each dry film, exposed under illuminance of 1,000 mj/cm$^2$ by means of a 5 kw ultra high pressure mercury lamp, and then developed for twice as long as the time at which the unexposed dry film was dissolved to obtain a negative image corresponding to the wedge. Thus, the step number at which the corresponding part of the dry film was thoroughly elluted (clear step number) was examined. A higher step number corresponds to a higher sensitivity.

(4) Evaluation of Pencil Hardness:

The exposure corresponding to the clear step number of 12 was applied to the whole surface of each dry film, the development was carried out under the same condition as described in (3), and then the resulting film was cured for 50 minutes at 140° C. in a hot-air circulation type drying oven. The hardness of each film was determined in accordance with JIS K 5400 6-14.

(5) Evaluation of Adhesiveness:

Exposure, development and after-curing processings were carried out in the same manner as in the evaluation of pencil hardness, and a cross-cut adhesion test was performed in accordance with JIS K 5400 6-15.

(6) Evaluation of Insulation Resistance:

Exposure, development and after-curing processings were carried out in the same manner as in the evaluation of pencil hardness, except that a both-sided copper laminate having the IPC-B-25 test pattern was used, and the value of resistance at which DC 500 V had been applied for 1 minute was determined using "TR-8601" made by Advantest Co. in accordance with JIS Z 3197.

(7) Evaluation of Solvent Resistance:

Exposure, development and after-curing processing were carried out in the same manner as in the evaluation of solvent resistance, and each sample was soaked for one hour in 1,1,1-trichloroethane kept at 20° C. Then, the condition and the adhesiveness of the resulting films were judged collectively.

(8) Evaluation of Acid Resistance:

Exposure, development and after-curing processings were carried out in the same manner as in the evaluation of solvent resistance, and each sample was soaked for 30 minutes at 20° C. in a 10 mol % aqueous solution of sulfuric acid. Then, the condition and the adhesiveness of the resulting film were judged collectively.

(9) Evaluation of Resolution:

The imagewise exposure corresponding to the clear step number of 12 was applied to the surface of each dry film using a mask-pattern (line/space=1/1) and the development was carried out to form a resist pattern. The resulting resist pattern was observed by means of a microscope ($\times 100$) to judge a line width of the mask-pattern formed separately by each resist.

The results of the evaluations of the liquid light-sensitive resinous compositions prepared in Examples 1 to 11 and Comparative Examples 1 to 3 were shown in Table 2 and 3.

EFFECTS OF THE INVENTION

Since the drying by heating carried out after the liquid light-sensitive resinous composition of this invention was coated on a printed circuit board makes the film surface lose its tackiness, the exposure in the condition that a pattern mask is in contact with the film surface becomes feasible. In addition, the composition of this invention has high sensitivity, and can be developed with an alkaline aqueous solution.

Further, the composition of this invention can provide a film excellent in electrical and mechanical characteristics and chemical resistances by the heat curing subsequent to development. Therefore, it can be used as a permanent protective mask for printed circuit boards.

What is claimed is:

1. A liquid heat-sensitive and light-sensitive resinous composition containing as main components (A) a photopolymerizable compound prepared by reacting a novolak type epoxy compound with, successively, an unsaturated monocarboxylic acid represented by at least one of formula (I) and (II) and a saturated or unsaturated polybasic acid anhydride, (B) a photopolymerizable compound having at least one ethylenic unsaturated double bond, (C) an epoxy compound having at least one epoxy group, (D) a photopolymerization initiator, (E) a thermosetting catalysts capable of making an epoxy group undergo a thermal reaction, and (F) an organic solvent:

(I)

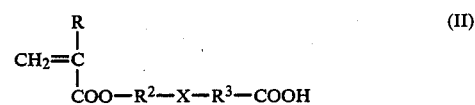

(II)

wherein R represents —H or —$CH_3$; $R^1$, $R^2$ and $R^3$ each represents an unsubstituted or substituted alkylene group, an unsubstituted or substituted arylene group, or an unsubstituted or substituted aralkylene group, and X represents —COO—, —OCO— or —O—.

2. A liquid heat-sensitive and light-sensitive resinous composition as in claim 1, wherein R represents —H or —$CH_3$; $R^1$, $R^2$ and $R^3$ each represents an unsubstituted or substituted alkylene group containing 1 to 10 carbon atoms, an unsubstituted or substituted arylene group containing 6 to 12 carbon atoms, or an unsubstituted or

TABLE 2

| | | List-1 of Properties of Light-Sensitive Resinous Compositions | | | | | | | |
|---|---|---|---|---|---|---|---|---|---|
| | Resin No. | Develop-ability | Sensi-tivity | Pencil Hardness | Adhesive-ness | Insulation Resistance | Solvent Resistance | Acid Resistance | Resolution |
| Example 1 | 1 | 10 sec. | step 14 | 6H | 100/100 | $7.8 \times 10^{13}$ | ○ | ○ | 80μ |
| Example 2 | 2 | 10 sec. | step 14 | 6H | 100/100 | $3.0 \times 10^{13}$ | ○ | ○ | 80μ |
| Example 3 | 3 | 10 sec. | step 16 | 5H | 100/100 | $1.0 \times 10^{13}$ | ○ | ○ | 100μ |
| Example 4 | 4 | 30 sec. | step 14 | 5H | 100/100 | $1.5 \times 10^{13}$ | ○ | ○ | 100μ |
| Example 5 | 5 | 20 sec. | step 14 | 5H | 100/100 | $7.7 \times 10^{13}$ | ○ | ○ | 100μ |
| Example 6 | 6 | 15 sec. | step 15 | 5H | 100/100 | $2.5 \times 10^{13}$ | ○ | ○ | 120μ |
| Example 7 | 7 | 10 sec. | step 14 | 5H | 100/100 | $1.5 \times 10^{13}$ | ○ | ○ | 120μ |
| Comparative Example 1 | 8 | 10 sec. | step 11 | 5H | 100/100 | $2.6 \times 10^{12}$ | ○ | ○ | 200μ |
| Comparative Example 2 | 9 | 10 sec. | step 10 | 6H | 100/100 | $2.7 \times 10^{13}$ | ○ | ○ | 150μ |

Note:
The symbol " " means the state such that the gloss and adhesiveness of the resulting film were not substantially deteriorated.

TABLE 3

| | | List-2 of Properties of Light-Sensitive Resinous Compositions | | | | | | |
|---|---|---|---|---|---|---|---|---|
| | Resin No. | Develop-ability | Sensi-tivity | Pencil Hardness | Adhesive-ness | Insulation Resistance | Solvent Resistance | Acid Resistance |
| Example 8 | 1 | 10 sec. | step 14 | 5H | 100/100 | $3.5 \times 10^{13}$ | ○ | ○ |
| Example 9 | 3 | 10 sec. | step 16 | 5H | 100/100 | $1.0 \times 10^{13}$ | ○ | ○ |
| Example 10 | 6 | 10 sec. | step 13 | 5H | 100/100 | $4.6 \times 10^{13}$ | ○ | ○ |
| Example 11 | 7 | 10 sec. | step 13 | 5H | 100/100 | $1.4 \times 10^{13}$ | ○ | ○ |
| Comparative Example 3 | 9 | 25 sec. | step 9 | 4H | 100/100 | $2.7 \times 10^{13}$ | ○ | ○ |

While the invention has been described in detail and with reference to specific embodiments thereof, it will be apparent to one skilled in the art that various changes and modifications can be made therein without departing from the spirit and scope thereof.

substituted aralkylene group containing 7 to 21 carbon atoms.

3. A liquid heat-sensitive and light-sensitive resinous composition as in claim 1, wherein R represents —H or —$CH_3$; $R^1$, $R^2$ and $R^3$ each represents an unsubstituted or substituted alkylene group containing 2 to 6 carbon atoms, an unsubstituted or substituted arylene group containing 6 to 10 carbon atoms, or an unsubstituted or substituted aralkylene group containing 7 to 15 carbon atoms.

4. A liquid heat-sensitive and light-sensitive resinous composition as in claim 1, wherein the unsaturated carboxylic acid reacted with the novolak type epoxy resin is from 0.8 to 1.2 equivalent of carboxyl groups per 1 equivalent of epoxy groups of the novolak type epoxy resin, and the amount of polybasic acid anhydride reacted is from 0.1 to 1.0 equivalent per 1 equivalent of epoxy groups of the novolak type epoxy resin.

5. A liquid heat-sensitive and light-sensitive resinous composition as in claim 1, wherein the unsaturated carboxylic acid reacted with the novolak type epoxy resin is from 0.9 to 1.1 equivalent of carboxyl groups per 1 equivalent of epoxy groups of the novolak type epoxy resin and the amount of polybasic acid anhydride is 0.3 to 1.0 equivalent per 1 equivalent of epoxy groups of the novolak type epoxy resin.

6. A liquid heat-sensitive and light-sensitive resinous composition as in claim 1, wherein the photopolymerizable compound comprises from 10 to 60 parts by weight per 100 parts by weight of solid components in the liquid light-sensitive resinous composition.

7. A liquid heat-sensitive and light-sensitive resinous composition as in claim 1, wherein the photopolymerization initiators are used in an amount of from 0.1 to 20 parts by weight per 100 parts by weight of the solid components in the liquid light-sensitive resinous composition.

8. A liquid heat-sensitive and light-sensitive resinous composition as in claim 1, wherein the epoxy compounds are used in an amount of from 1 to 40 parts by weight per 100 parts by weight of the solid components in the liquid light-sensitive resinous composition.

9. A liquid heat-sensitive and light-sensitive resinous composition as in claim 1, wherein the thermosetting catalysts are used in an amount of from 0.01 to 10 parts by weight per 100 parts by weight of the solid components in the liquid light-sensitive resinous composition.

10. A process for forming an image, comprising coating the liquid heat-sensitive and light-sensitive resinous composition of claim 1 on a substrate, curing the coat sufficiently by heat to render the surface of the coat nonadhesive, contacting the face of a pattern mask to the surface of the coated composition, exposing the coating composition to light through the pattern mask to cure the resinous composition and render it insoluble in an alkaline aqueous solution relative to the non-light-cured composition, and then developing with an alkaline aqueous solution to elute the uncured coat.

11. A process as in claim 10, wherein said heat curing is carried out from 5 minutes to 10 minutes at a temperature of from 70° C. to 120° C.

12. A process as in claim 10, wherein the liquid light-sensitive resinous composition is heated after image formation to effect after-curing.

* * * * *